US008178777B2

(12) United States Patent
Asai

(10) Patent No.: US 8,178,777 B2
(45) Date of Patent: May 15, 2012

(54) METHOD OF MANUFACTURING SOLAR CELL AND SOLAR CELL MANUFACTURED THEREBY

(75) Inventor: Masahito Asai, Shiki-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 1178 days.

(21) Appl. No.: 10/929,444

(22) Filed: Aug. 31, 2004

(65) Prior Publication Data

US 2005/0194037 A1    Sep. 8, 2005

(30) Foreign Application Priority Data

Oct. 8, 2003  (JP) .................................. 2003-349359

(51) Int. Cl.
*H01L 31/0224* (2006.01)

(52) U.S. Cl. ........................................................ 136/256

(58) Field of Classification Search .................. 136/256
See application file for complete search history.

(56) References Cited

U.S. PATENT DOCUMENTS

| | | | | |
|---|---|---|---|---|
| 5,151,373 A | * | 9/1992 | Deguchi et al. | 156/274.8 |
| 5,428,249 A | * | 6/1995 | Sawayama et al. | 257/746 |
| 5,472,885 A | * | 12/1995 | Matsuno et al. | 438/72 |
| 5,775,219 A | | 7/1998 | Shimazu et al. | |
| 5,826,516 A | | 10/1998 | Shimazu et al. | |
| 5,942,048 A | * | 8/1999 | Fujisaki et al. | 136/256 |
| 6,071,437 A | | 6/2000 | Oya | |
| 6,084,175 A | * | 7/2000 | Perry et al. | 136/256 |
| 6,143,976 A | * | 11/2000 | Endros | 136/256 |
| 6,340,525 B1 | * | 1/2002 | Akamatsu et al. | 428/364 |
| 6,394,163 B1 | * | 5/2002 | Shirakawa | 156/433 |
| 6,878,255 B1 | * | 4/2005 | Wang et al. | 204/452 |
| 2002/0148499 A1 | * | 10/2002 | Tanaka | 136/256 |
| 2003/0000571 A1 | * | 1/2003 | Wakuda et al. | 136/256 |
| 2003/0005955 A1 | * | 1/2003 | Shiotsuka et al. | 136/251 |
| 2003/0137564 A1 | * | 7/2003 | Nakashima | 347/68 |
| 2004/0025721 A1 | * | 2/2004 | Pingel | 101/123 |

FOREIGN PATENT DOCUMENTS

| | | | |
|---|---|---|---|
| EP | 0 729 189 A1 | 8/1996 | |
| EP | 0 851 511 A1 | 7/1998 | |
| JP | 358054318 A | * | 3/1983 |
| JP | 62-156881 | 7/1987 | |
| JP | 6-334203 A | 12/1994 | |
| JP | 9-164654 A | 6/1997 | |
| JP | 9-164655 A | 6/1997 | |
| JP | 10-150216 A | 6/1998 | |
| JP | 2000-188414 A | 7/2000 | |
| JP | 2002-13979 A | 1/2002 | |
| KR | 95-12542 A | 6/1995 | |
| WO | WO 00/44051 A1 | 7/2000 | |
| WO | WO 03/072500 A1 | 9/2003 | |

\* cited by examiner

*Primary Examiner* — Jennifer Michener
*Assistant Examiner* — Dustin Q Dam
(74) *Attorney, Agent, or Firm* — Nixon & Vanderhye P.C.

(57) ABSTRACT

A solar cell attaining high efficiency in photoelectric conversion is provided. A method of manufacturing a solar cell having a grid electrode and a main electrode for external output of electric power from the grid electrode includes the steps of forming a small-width grid electrode on a light-receiving surface of a substrate having a pn junction by sintering a metal paste material, and forming a bar-shaped main electrode electrically connected to the grid electrode.

10 Claims, 5 Drawing Sheets

DIRECTION OF PRINTING

METHOD OF MANUFACTURING SOLAR CELL AND SOLAR CELL MANUFACTURED THEREBY

This nonprovisional application is based on Japanese Patent Application No. 2003-349359 filed with the Japan Patent Office on Oct. 8, 2003, the entire contents of which are hereby incorporated by reference.

FIELD OF THE TECHNOLOGY

The present technology relates to a solar cell having a pn junction, and more particularly to a solar cell attaining high efficiency in photoelectric conversion.

DESCRIPTION OF THE BACKGROUND ART

In recent days, a solar cell directly converting solar energy to electric energy has increasingly been expected to serve as a next-generation energy source in particular from a viewpoint of global environmental issues. Among various types of solar cells such as a solar cell using a compound semiconductor or an organic material, a solar cell using silicon crystal is mainly employed these days.

In order to improve photoelectric conversion efficiency in a solar cell, an electrode structure in which an area for a light-receiving surface electrode is minimized and series resistance is suppressed has conventionally been proposed. For example, Japanese Patent Laying-Open No. 62-156881 discloses a solar cell shown in FIG. 5. This solar cell is manufactured in the following manner. A light-receiving surface electrode pattern consisting of a main electrode 51 and a grid electrode 52 is formed on an antireflection coating 54 on a silicon substrate 53 by screen printing, followed by heat treatment at approximately 700° C. Accordingly, a silver paste for forming a grid electrode penetrates antireflection coating 54, and the grid electrode is connected to the main electrode. Such a solar cell attains excellent electric contact with silicon substrate 53.

On the other hand, in the conventional solar cell, a ratio of the light-receiving surface electrode pattern to a light-receiving area is as high as approximately 10%. Accordingly, the light-receiving area contributing to power generation is reduced, and surface recombination velocity at main electrode 51 and grid electrode 52 is large, resulting in poorer electric characteristics of the solar cell, in particular lower open-circuit voltage. Though it is possible to increase the light-receiving area contributing to power generation by reducing the electrode area with respect to the light-receiving area by approximately 5% as well as to reduce the surface recombination velocity for raising the open-circuit voltage, series resistance is disadvantageously increased. Then, a fill factor of the solar cell becomes smaller, and obtained electric power is reduced.

SUMMARY

A feature of the exemplary embodiment presented herein is to solve the above-described technical problems, and to provide a solar cell attaining high efficiency in photoelectric conversion.

In order to achieve such a feature, a method of manufacturing a solar cell having a grid electrode and a main electrode for external output of electric power from the grid electrode according to the present invention includes the steps of: forming a small-width grid electrode on a light-receiving surface of a substrate having a pn junction by firing a metal paste material; and forming a bar-shaped main electrode electrically connected to the grid electrode.

Preferably, the grid electrode is formed by a screen method, in which a plate-shaped body including a small-width opening or a gauze having a thick film including a small-width opening formed by electrodeposition or adhesion is used as a screen, an ink-jet method, or a dispense method. In the screen method, desirably, a distance between openings adjacent in their longitudinal direction in the screen is smaller than a width of the bar-shaped main electrode, and the grid electrodes adjacent in the longitudinal direction are connected to each other by formation of the bar-shaped main electrode.

In the step of forming the grid electrode, preferably, a registration mark for registration of the grid electrode and the main electrode is formed on the substrate, and the registration mark is provided at a position where the main electrode is to be formed. In addition, suitably, the grid electrode and the main electrode are positioned in accordance with the registration mark formed on the substrate in the step of forming the grid electrode and the registration mark provided on the screen for forming the main electrode, and the registration mark formed on the substrate in the step of forming the grid electrode is recognized by a CCD camera. Here, the registration mark preferably has a circular or oval shape.

In the screen method, desirably, a printing squeegee is driven in a longitudinal direction of the opening in the screen. In addition, a gauze may be used as a screen in the step of forming the main electrode. The squeegee used in the screen method has a tip end portion for scraping off a paste and a body portion supporting the tip end portion. Suitably, the tip end portion is made of a flexible and thin plate-shaped body, and the body portion is made of a rigid and thick plate-shaped body. On the other hand, when a plate-shaped body having a small-width opening is adopted as the screen, the screen preferably has at least one connection portion in the opening, and the connection portion has a notch on a substrate side.

In the step of forming the grid electrode, preferably, a paste composed of a metal material achieving excellent ohmic contact with an $n^+$ layer is used, and in the step of forming the main electrode, a paste composed of a metal material achieving excellent solder wettability and contact property with the substrate is used. Here, viscosity of the paste used in the step of forming the grid electrode may be different from viscosity of the paste used in the step of forming the main electrode.

A solar cell according to the exemplary embodiment presented herein is manufactured with a method including the steps of forming a small-width grid electrode on a light-receiving surface of a substrate having a pn junction by firing a metal paste material; and forming a bar-shaped main electrode electrically connected to the grid electrode.

According to the exemplary embodiment, the grid electrode with a small width can be formed to a large thickness. Therefore, a solar cell having a large light-receiving area contributing to power generation and small series resistance in the grid electrode can be manufactured, thereby attaining improved photoelectric conversion efficiency.

DESCRIPTION OF THE PREFERRED EMBODIMENTS

Figure 1A:
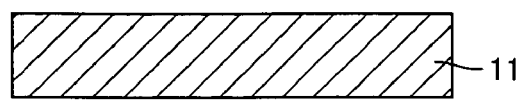
FIGS. 1A to 1I show the steps in a manufacturing method according to an exemplary embodiment.

The method of manufacturing a solar cell according to an exemplary embodiment includes the steps of forming a small-width grid electrode on a light-receiving surface of a substrate having a pn junction by firing a metal paste material, and forming a bar-shaped main electrode electrically connected to the grid electrode. By individually forming the grid electrode and the main electrode under respective suitable conditions, a high-performance solar cell having a small-width grid electrode and a bar-shaped main electrode can be manufactured.

In the step of forming the grid electrode, preferably, a plate-shaped body including a small-width opening or a gauze having a thick film including a small-width opening formed by electrodeposition or adhesion is used as a screen. Such a screen is suitable in that a fine grid electrode pattern in the solar cell can be formed, that is, the grid electrode of a smaller width can be formed to a larger thickness. Accordingly, loss of light due to shade of the electrode is significantly reduced, and at the same time, the area for the electrode is made smaller. Therefore, the surface recombination velocity at the electrode is decreased as compared with that in the conventional solar cell, thereby attaining a larger open-circuit voltage. In addition, as the grid electrode having a smaller width can be formed to a larger thickness, the series resistance in the grid electrode can be reduced and the fill factor is effectively increased. Photoelectric conversion efficiency in the solar cell can thus be improved to a large extent.

Though dependent on a physical property of a paste used for printing, in order to form a grid pattern of a small width, generally, a screen used in the step of forming the grid electrode has an opening of a small width preferably not larger than 0.15 mm, and more preferably not larger than 0.12 mm. In addition, in order to avoid disconnection of the grid electrode, the opening has a width preferably not smaller than 0.07 mm, and more preferably not smaller than 0.10 mm. For example, a thin stainless plate having a small-width opening formed by laser or the like may be adopted as such a screen. When dimension accuracy is not much demanded, a screen implemented by a common gauze may be employed as a screen to be used in the step of forming the bar-shaped main electrode. When printing with high accuracy is to be performed, however, a screen implemented by the gauze having a thick film including a small-width opening formed by electrodeposition or adhesion is preferably used.

When the screen having a small-width opening formed in the thin stainless plate by using laser or the like is employed, the opening may be wide-open in printing if the opening has excessively large length, which results in a larger width of the grid. Accordingly, in such a case, the screen preferably has at least one connection portion in the opening, and the connection portion has a notch on a substrate side. As the connection portion has a notch on the substrate side, the paste is introduced in the notch. Therefore, the printed grid electrode is not divided, thereby achieving a continuous shape of a small width. In order for the connection portion to attain a function to suppress widening of the opening and to leave a room for accommodating the paste in the notch during printing, the notch in the connection portion preferably has a depth comparable to approximately half the thickness of the screen.

Figure 6A:
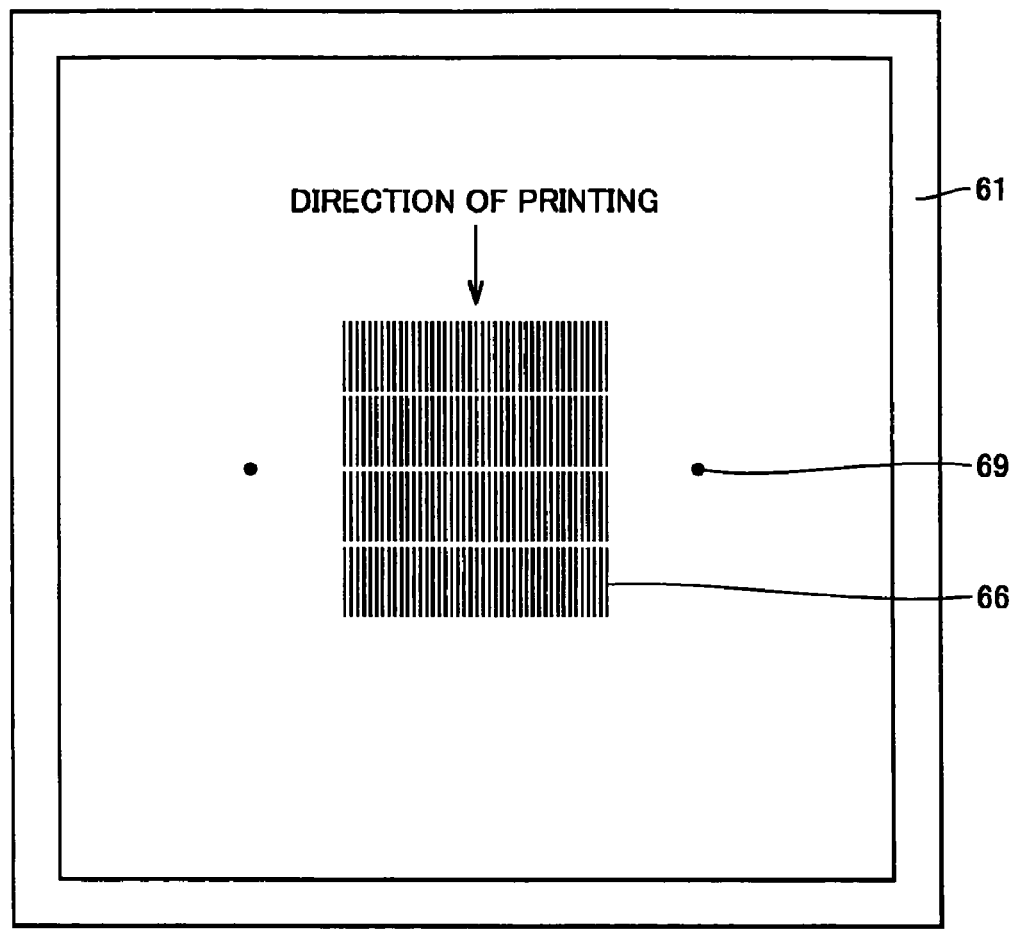
FIG. 6A is a plan view showing a screen for forming a grid electrode in an exemplary embodiment.
Figure 6B:
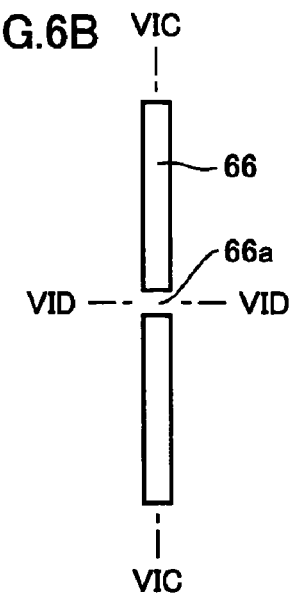
FIG. 6B is an enlarged plan view of an opening in the screen.
Figure 6C:
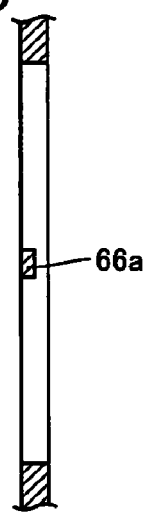
FIG. 6C is a cross sectional view along the line VIC-VIC in FIG. 6B.
Figure 6E:
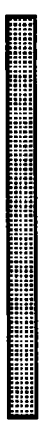
FIG. 6E is a plan view showing a grid electrode of a uniform width without disconnection.
Figure 6D:
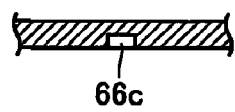
FIG. 6D is a cross sectional view along the line VID-VID in FIG. 6B.

FIG. 6B shows an example in which an opening 66 formed in a screen for forming the grid electrode shown in FIG. 6A has one connection portion 66a therein, and connection portion 66a has a notch on the substrate side. FIG. 6B is an enlarged plan view of such an opening. FIG. 6C is a cross sectional view along the line VIC-VIC in FIG. 6B. In FIG. 6C, the opening has one connection portion 66a in the opening on the side opposite to the substrate (on the left in FIG. 6C). FIG. 6D is a cross sectional view along the line VID-VID in FIG. 6B. In FIG. 6D, a notch 66c is provided on the substrate side (lower portion in FIG. 6D). As the screen has connection portion 66a in the opening, widening of the opening and the larger width of the grid electrode during printing can be avoided in spite of larger length of the opening. In addition, the paste is printed through the screen, the paste is introduced in notch 66c in the opening. Therefore, the grid electrode of a uniform width without disconnection as shown in FIG. 6E can be formed.

Forming of the grid electrode with the ink-jet method or the dispense method allows fine, precise and rapid application of the paste, and is preferable in terms of mass productivity and lower cost. The ink-jet method refers to a method of applying paste on the substrate by atomizing and spraying the paste from a nozzle. The ink-jet method includes an electrostatic ink-jet method of atomizing the paste by a pressure generated when a piezoelectric vibrator vibrates, and a Bubble-Jet® method in which fine paste particles are instantly heated by a heater provided in a nozzle and sprayed by evaporation thereof for application onto the substrate, both of which are applicable in the manufacturing method of the present invention. On the other hand, the dispense method refers to a method of discharging the paste through a thin pipe for drawing, in which a plurality of thin pipes are arranged with constant intervals and a plurality of grid electrodes can simultaneously be formed. Depending on a method of forming the grid electrode, a property of the paste or the like, generally, the grid electrode has a width preferably of 0.12 mm to 0.15 mm, and more preferably a width of 0.10 mm to 0.12 mm, in order to reduce the electrode area occupied on the light-receiving surface, to enhance conversion efficiency, and to prevent disconnection of the electrode of a small width.

Figure 2:
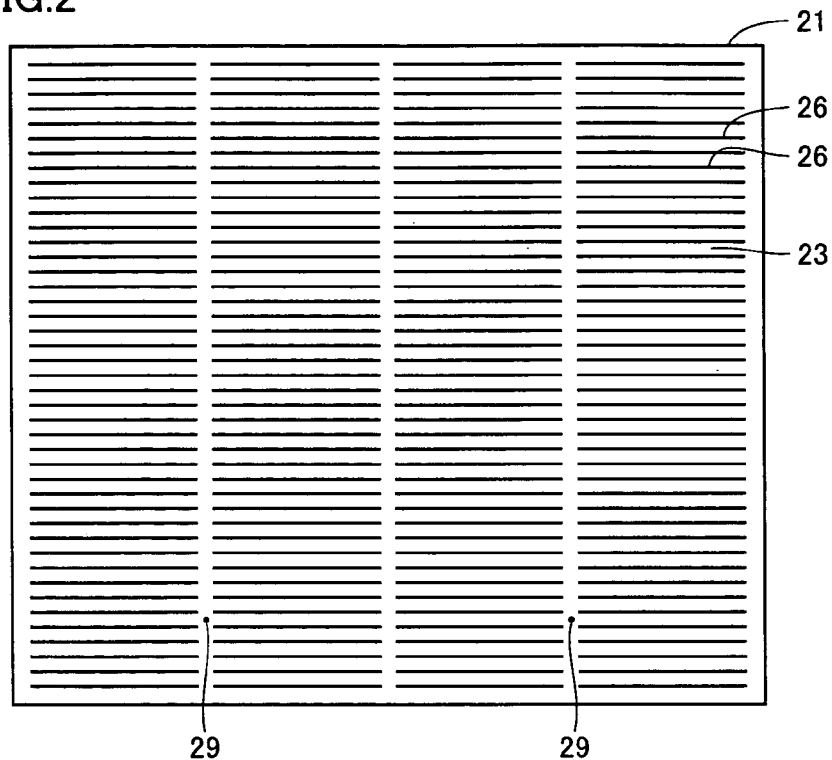
FIG. 2 is a plan view showing a pattern of a paste layer forming a grid electrode in an exemplary embodiment.
Figure 3:
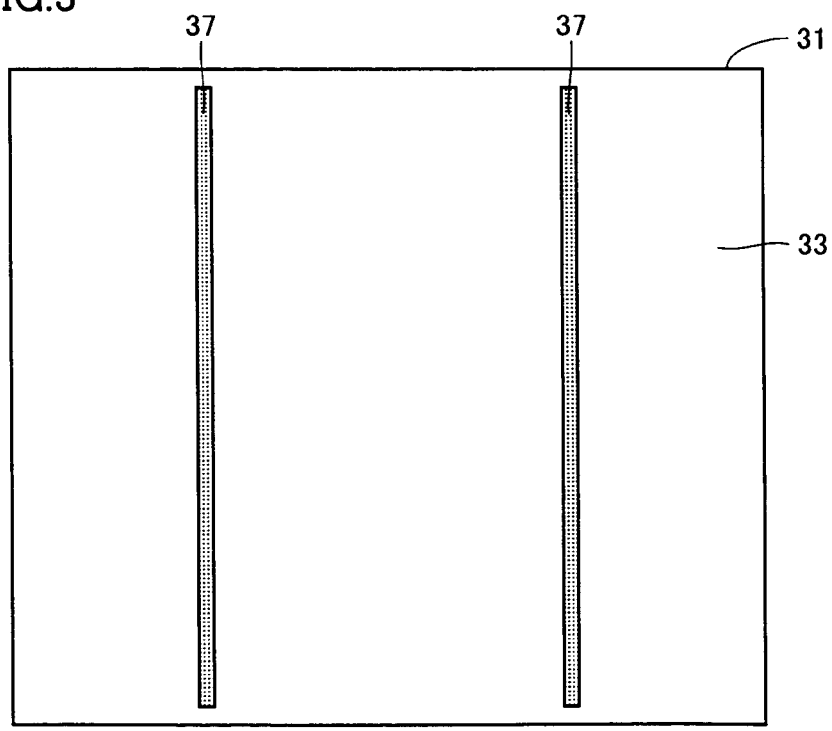
FIG. 3 is a plan view showing a pattern of a paste layer for forming a main electrode in an exemplary embodiment.
Figure 4:
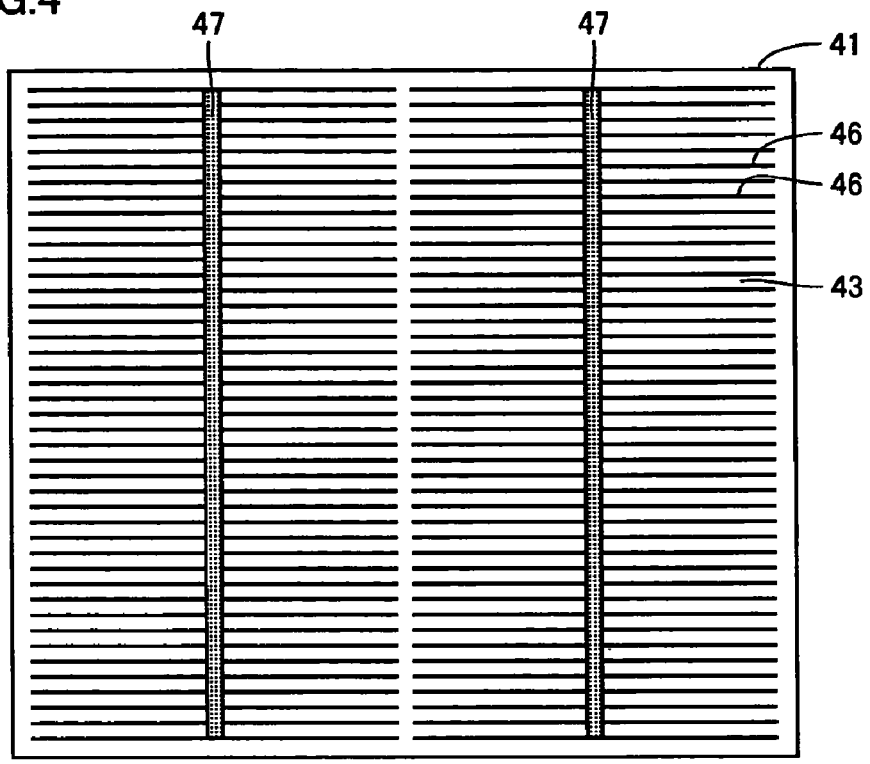
FIG. 4 is a plan view showing an electrode pattern in a solar cell according to an exemplary embodiment.
Figure 5:
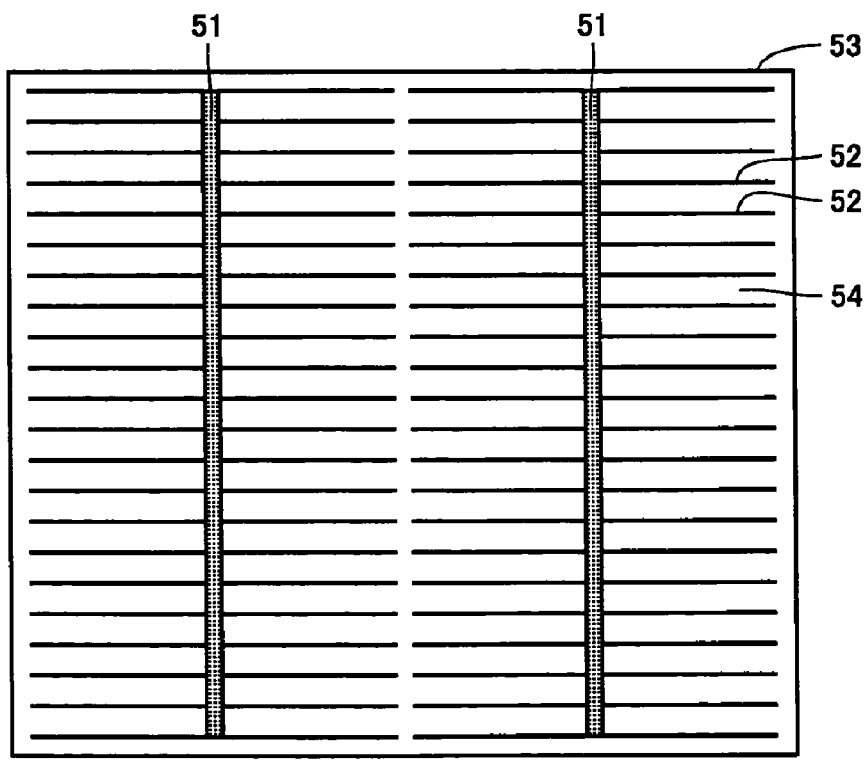
FIG. 5 is a plan view showing an electrode pattern in a conventional solar cell.

FIG. 2 illustrates a pattern of a paste layer 26 serving as the grid electrode. In FIG. 2, paste layer 26 is formed on an antireflection coating 23 on a silicon substrate 21. FIG. 3 illustrates a pattern of a paste layer 37 serving as the main electrode. In FIG. 3, paste layer 37 is formed on an antireflection coating 33 on a silicon substrate 31. In the example in FIGS. 2 and 3, the pattern of the paste layer serving as the main electrode is implemented by two lines orthogonal to the paste layer serving as the grid electrode. Here, a distance between the grid electrodes adjacent in a longitudinal direction thereof is made smaller than a width of the main electrode. Accordingly, the grid electrodes adjacent in the longitudinal direction are electrically connected to each other by formation of the bar-shaped main electrode. This is achieved, for example, by making the distance between the openings in the screen adjacent in their longitudinal direction smaller than the width of the bar-shaped main electrode in the step of forming the grid electrode. FIG. 4 shows an electrically connected state. In FIG. 4, grid electrode 46 formed on antireflection coating 43 on silicon substrate 41 is electrically connected to main electrode 47. main electrode 47.

Figure 8:
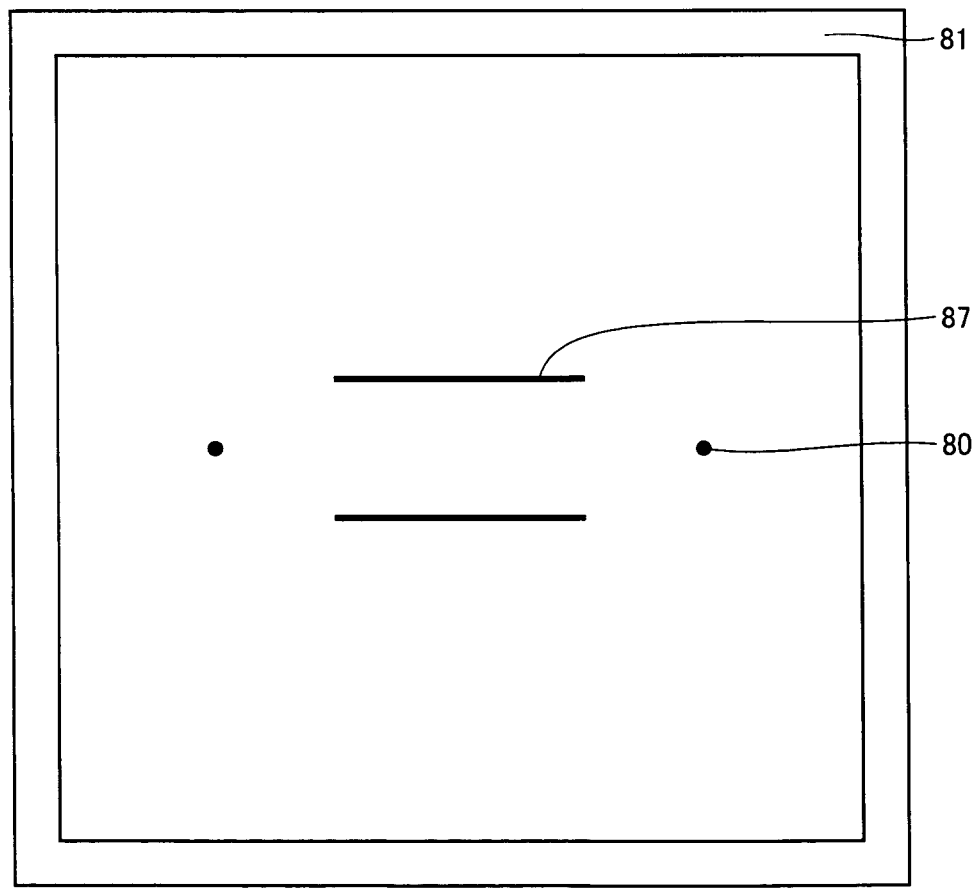
FIG. 8 is a plan view showing a screen for forming a main electrode in an exemplary embodiment.

Preferably, in the step of forming the grid electrode, a registration mark is formed on the substrate, in order to facilitate registration of the grid electrode and the main electrode as well as to allow accurate registration thereof. In addition, the registration mark is preferably formed at a position where the main electrode is to be formed, because such a mark can no longer be seen in the substrate after the main electrode is formed. FIG. 6A illustrates the screen for forming the grid electrode. Such a screen is provided within a screen frame 61, and has a hole 69 for forming the registration mark. FIG. 8 illustrates the screen for forming the main electrode. The screen shown in FIG. 8 is provided within a screen frame 81, and has an opening 87 for forming the main electrode and a hole 80 for forming the registration mark. The registration mark is formed on the substrate by means of hole 69 shown in FIG. 6A, along with formation of the grid electrode. The registration mark is recognized by a CCD camera or the like. Then, the screen is moved in accordance with the registration mark shown in FIG. 8 (hole 80), so that the grid electrode and the main electrode are positioned with high accuracy. The registration mark preferably has a circular or oval shape. This is because such a shape does not tend to suffer from a defect such as a thin spot in printing, or even if a thin spot may be produced, the registration mark of such a shape is easily recognized by the CCD camera.

Figure 7A:
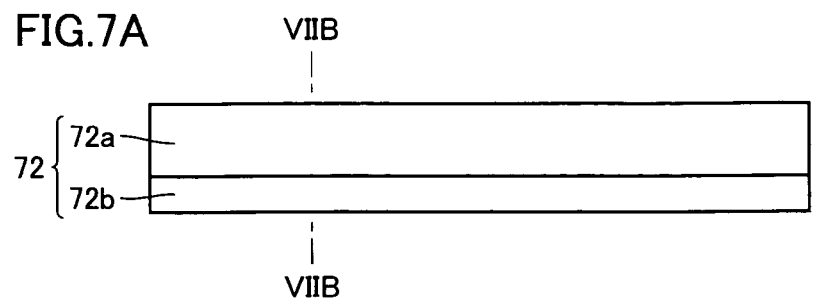
FIG. 7A is a front view of a squeegee for forming a grid electrode in an exemplary embodiment.
Figure 7B:
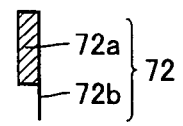
FIG. 7B is a cross sectional view along the line VIIB-VIIB in FIG. 7A.
Figure 7C:
FIGS. 7C and 7D are cross sectional views of the grid electrode.
Figure 7D:

FIG. 7A illustrates a printing squeegee used in forming the grid electrode with the screen method in the present invention. In addition, FIG. 7B shows a cross section along the line VIIB-VIIB in FIG. 7A. When a printing squeegee 72 has a tip end portion 72b for scraping off a paste, which is a flexible and thin plate-shaped body, and a body portion 72a supporting tip end portion 72b, which is a rigid and thick plate-shaped body, a pattern of a small width can accurately be formed. FIG. 7C shows a cross section of the grid electrode formed by using a conventional printing squeegee, and FIG. 7D shows a cross section of the grid electrode formed by using a squeegee in the present invention. As shown in FIG. 7C, as in the conventional example, when a commonly-used squeegee made of urethane is employed, the cross section of the grid electrode exhibits a shape recessed in the center. On the other hand, when the squeegee in the present invention is employed, the cross section of the grid electrode exhibits a rectangular shape, whereby a thick electrode is obtained and its cross sectional area is large. Therefore, even when the grid electrode has a small width, the series resistance can be suppressed.

When the screen method is adopted, preferably, a drive direction of the printing squeegee coincides with the longitudinal direction of the opening in the screen as shown in FIG. 6A, so that the small-width grid electrode without disconnection is readily formed. Here, coincidence of the drive direction of the printing squeegee with the longitudinal direction of the opening in the screen refers to not only complete coincidence of the directions but also substantial coincidence thereof. This is because the small-width grid electrode without disconnection is readily formed effectively when substantial coincidence is achieved. Though dependent on the viscosity of the paste or pressure by the squeegee, generally, substantial coincidence includes a case in which the drive direction of the printing squeegee is different from the longitudinal direction of the opening in the screen within a range of ±10°.

A paste composed of a metal material attaining excellent ohmic contact with an $n^+$ layer in the silicon substrate through the antireflection coating by firing is preferably adopted as the paste used in the step of forming the grid electrode. For example, a silver paste for what is called fire through obtained by doping the silver paste with phosphorus or a phosphorus-based compound by an amount of 0.05 to 0.3 wt % is suitably used. On the other hand, in the step of forming the main electrode, a paste composed of a metal material attaining excellent solder wettability and contact property with the substrate is preferably adopted. For example, a silver paste attaining excellent solder wettability and adhesion to the substrate without containing phosphorus or a phosphorus-based compound is suitably used. The silver paste containing a large amount of phosphorus or a phosphorus-based compound generally has an excellent fire through property, however, it has poor solder wettability and attains poor adhesion to the substrate. In addition, even when pastes having identical composition are used for forming the grid electrode and the main electrode respectively, the pastes having viscosity different from each other are employed. In doing so, printing can be performed in a manner suitable for respective electrodes, with improved accuracy.

As described above, an embodiment has been discussed by exemplarily showing what is called a conventional type solar cell. In addition to such a solar cell, for example, a BSF-type solar cell and a solar cell having an electrode surface textured can also be manufactured.

The solar cell according to the exemplary embodiment presented herein is characterized by being manufactured with the method described above. In forming a surface electrode in a solar cell, the grid electrode is made to have a smaller width and a larger thickness, while the main electrode serves to connect the grid electrodes adjacent in their longitudinal direction. In this manner, the area for the electrode can be reduced without increasing the series resistance of the surface electrode. Therefore, significant improvement in conversion efficiency can be achieved in the solar cell according to the present invention.

EXAMPLE 1

Figure 1B:
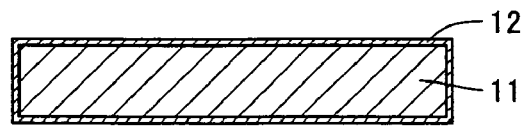
Figure 1C:
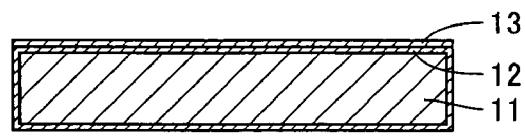
Figure 1D:
Figure 1E:
Figure 1F:
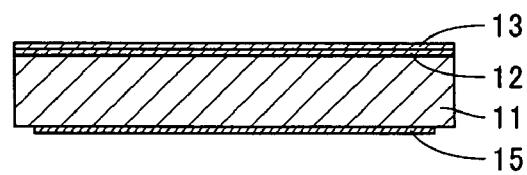

The solar cell according to an exemplary embodiment was manufactured in the steps shown in FIGS. 1A to 1I. First, the surface of a p-type silicon substrate 11 was treated with a high-temperature sodium hydroxide aqueous solution, so as to remove a surface damage layer (FIG. 1A). Then, an $n^+$ layer (high concentration n layer) 12 was formed on the entire surface of p-type silicon substrate 11 through vapor phase diffusion of $POCl_3$, as shown in FIG. 1B. Thereafter, the surface of $n^+$ layer 12 was washed with hydrofluoric acid, and an antireflection coating 13 composed of silicon nitride was formed on the light-receiving surface side with plasma CVD (Chemical Vapor Deposition), as shown in FIG. 1C. Then, as shown in FIG. 1D, a resist ink layer 14 was formed on antireflection coating 13 by printing. Thereafter, a junction was separated by chemical etching with fluoro-nitric acid, and resist ink layer 14 was removed by a solvent (FIG. 1E). After the resist ink layer was removed, a silver paste obtained by mixing Al in Ag by several percent was printed on the backside opposite to the light-receiving surface of silicon substrate 11, so as to form a silver paste layer 15 serving as a backside electrode as shown in FIG. 1F, followed by drying.

Figure 1G:
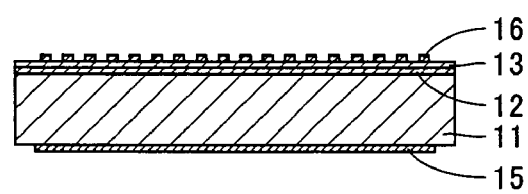
Figure 1H:
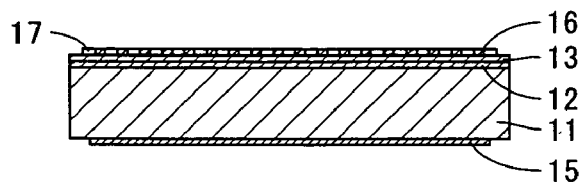
Figure 1I:
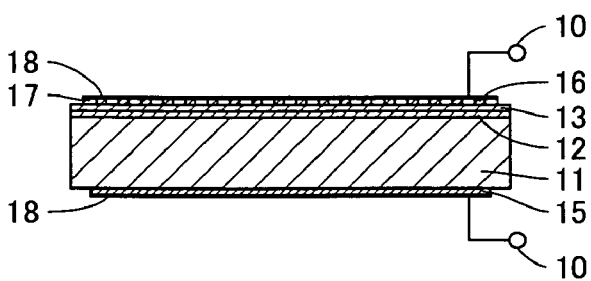

Thereafter, the silver paste was printed on the light-receiving surface of silicon substrate 11 with the screen method, so as to form a silver paste layer 16 serving as the small-width grid electrode as shown in FIG. 1G. Simultaneously, the registration mark (not shown) with respect to the main electrode was formed at a position where the main electrode is to be formed, followed by drying. Then, as shown in FIG. 1H, a pattern for a silver paste layer 17 serving as the bar-shaped main electrode was formed with the screen method in a manner similar to that in forming silver paste layer 16, followed by drying. After firing at a temperature of 700° C., the grid electrode was electrically connected to the main electrode. The light-receiving surface electrode and the backside electrode were formed as shown in FIG. 1I, and solder layers 18 were formed on the light-receiving surface electrode and the backside electrode with dip soldering and connected to leads 10 respectively. Finally, a solar cell having an electrode pattern as shown in FIG. 4 was obtained. As the obtained solar cell had the grid electrode of a small width and a large thickness, an area for the light-receiving surface electrode occupied in the light-receiving surface was small. Moreover, its series resistance was also small, and conversion efficiency was 17%.

The silver paste for forming the grid electrode was obtained by doping silver with phosphorus by an amount of 0.1 wt %. After firing at a temperature of 700° C., the silver paste penetrated the antireflection coating, whereby excellent electric connection with the $n^+$ layer was achieved. On the other hand, the silver paste for forming the main electrode was composed of a paste not containing phosphorus or a phosphorus-based compound, such as a mixture of silver powders, glass frit, and a resin or a solvent, and attained excellent solder wettability and contact property with the substrate.

As shown in FIG. 6A, printing of the silver paste serving as the grid electrode was performed by driving the printing squeegee in the longitudinal direction of opening 66 formed in the screen. Therefore, the formed silver paste layer had a uniform width without disconnection. After drying, silver paste layer 26 serving as the grid electrode and formed in stripes as well as registration mark 29 with respect to the main electrode were formed on substrate 21, as shown in FIG. 2. For the screen used for printing, a plate-shaped body having a small-width opening in a thin stainless plate formed by using laser was employed. Here, the opening had a width of 0.09 mm, and the silver paste layer formed in stripes had a width of 0.11 mm. FIG. 7A is a front view of the squeegee used for printing, and FIG. 7B shows a cross section of the same. Squeegee 72 used here was made of stainless, in which a body portion 72a was made of a rigid and thick plate-shaped member and a tip end portion 72b was made of a flexible and thin plate-shaped body. Therefore, the formed electrode had a rectangular cross section as shown in FIG. 7D, of which area was clearly larger than in the electrode as shown in FIG. 7C that had been obtained by using the conventional squeegee made of urethane.

The pattern of the silver paste layer serving as the main electrode was implemented by two lines orthogonal to the silver paste layer serving as the small-width grid electrode. Here, as the space between the grid electrodes adjacent in their longitudinal direction was made narrower than the width of the main electrode, the main electrode was electrically connected to the grid electrode when the main electrode was formed. In forming the silver paste layer serving as the main electrode, after the registration mark that had been formed on the substrate along with formation of the grid electrode was first recognized by the CCD camera, the screen was moved and positioned in accordance with the registration mark provided on the screen for forming the main electrode. Therefore, positioning of the grid electrode and the main electrode was performed with high accuracy.

Although the exemplary embodiment presented herein has been described and illustrated in detail, it is clearly understood that the same is by way of illustration and example only and is not to be taken by way of limitation, the spirit and scope being limited only by the terms of the appended claims.

What is claimed is:

1. A method of manufacturing a solar cell having a grid electrode and a main electrode for external output of electric power from said grid electrode, comprising:

forming a metal paste layer serving as a small-width grid electrode on a light-receiving surface of a substrate having a pn junction by a screen method, in which a plate-shaped body including multiple rows of small-width multiple elongated openings, the rows being along a first direction, each row comprising multiple elongated openings spaced from each other along the first direction, each of the openings having a length substantially larger than the width, said multiple rows spaced from each other and aligned along a second direction perpendicular to the first direction, wherein each of the multiple elongated openings is along the second direction, is used as a screen, forming a metal paste layer serving as a bar-shaped main electrode electrically connected to said grid electrode, and firing the metal paste layer serving as said grid electrode and the metal paste layer serving as said main electrode, wherein a distance between openings adjacent in a longitudinal direction in said screen is smaller than a width of said bar-shaped main electrode, and wherein said grid electrodes adjacent in the longitudinal direction are connected to each other by formation of said bar-shaped main electrode.

2. The method of manufacturing a solar cell according to claim 1, wherein in said forming of said grid electrode, a registration mark for registration of said grid electrode and said main electrode is formed on the substrate.

3. The method of manufacturing a solar cell according to claim 2, wherein said registration mark is provided at a position where said main electrode is to be formed.

4. The method of manufacturing a solar cell according to claim 2, wherein said grid electrode and said main electrode are positioned in accordance with said registration mark formed on the substrate in said forming of said grid electrode and said registration mark provided on the screen for forming said main electrode, and said registration mark formed on the substrate in said forming of said grid electrode is recognized by a CCD camera.

5. The method of manufacturing a solar cell according to claim 4, wherein said registration mark has a circular or oval shape.

6. The method of manufacturing a solar cell according to claim 1, wherein in said screen method, a drive direction of a printing squeegee coincides with the longitudinal direction of the opening in the screen.

7. The method of manufacturing a solar cell according to claim 1, wherein
in said screen method, a printing squeegee having a tip end portion for scraping off a paste and a body portion supporting said tip end portion is used,
said tip end portion is made of a flexible and thin plate-shaped body, and
said body portion is made of a rigid and thick plate-shaped body.

8. The method of manufacturing a solar cell according to claim 1, wherein
said screen is a plate-shaped body having a small-width opening and has at least one connection portion in said opening, and said connection portion has a notch on a substrate side.

9. The method of manufacturing a solar cell according to claim 1, wherein
viscosity of the paste used in said forming of said grid electrode is different from viscosity of the paste used in said forming of said main electrode.

10. A solar cell manufactured with a method including:
forming a metal paste layer serving as a small-width grid electrode on a light-receiving surface of a substrate having a pn junction by
a screen method, in which a plate-shaped body including multiple rows of small-width multiple elongated openings, the rows being along a first direction, each row comprising multiple elongated openings spaced from each other along the first direction, each of the openings having a length substantially larger than the width, said multiple rows spaced from each other and aligned along a second direction perpendicular to the first direction, wherein each of the multiple elongated openings is along the second direction is used as a screen,
forming a metal paste layer serving as a bar-shaped main electrode electrically connected to said grid electrode, and
firing the metal paste serving as said grid electrode and the metal paste layer serving as said main electrode, wherein
a distance between openings adjacent in a longitudinal direction in said screen is smaller than a width of said bar-shaped main electrode, and wherein
said grid electrodes adjacent in the longitudinal direction are connected to each other by formation of said bar-shaped main electrode.

\* \* \* \* \*